Dec. 8, 1964 M. C. STEELE ETAL 3,160,762

HALL EFFECT DEVICE EMPLOYING MECHANICAL STRESS APPLIED ACROSS CRYSTAL TO EFFECT CHANGE IN HALL VOLTAGE

Filed April 21, 1960 2 Sheets-Sheet 1

INVENTORS
RUBIN BRAUNSTEIN &
MARTIN C. STEELE

BY Morris A. Rabkin
ATTORNEY

INVENTORS
RUBIN BRAUNSTEIN &
MARTIN C. STEELE
BY Morris A. Rabkin
ATTORNEY

United States Patent Office 3,160,762
Patented Dec. 8, 1964

3,160,762

HALL EFFECT DEVICE EMPLOYING MECHANICAL STRESS APPLIED ACROSS CRYSTAL TO EFFECT CHANGE IN HALL VOLTAGE

Martin C. Steele and Rubin Braunstein, Princeton, N.J., assignors to Radio Corporation of America, a corporation of Delaware Filed Apr. 21, 1960, Ser. No. 23,802
1 Claim. (Cl. 307—88.5)

This invention relates generally to semiconductor switches for switching a voltage of one value and polarity to a voltage of another value and either of the same polarity, or zero, or of the opopsite polarity. More particularly, this invention relates to specially prepared semiconductor materials that utilize changes in their Hall voltages, in response to external stimuli, to provide a switching function. The semiconductor switches of the present invention are particularly useful in radiation detecting apparatus as detectors of nuclear particles, in logic circuits as bistable elements, and in transducers as pressure sensing means.

It has been proposed to use semiconductor devices as switches in the past, but all of the prior art semiconductor devices utilize a P–N junction structure, as in a transistor, for example. Also, in substantially all of the semiconductor devices used heretofore in switching arrangements, the switching function is accomplished by controlling a bias on a control element of the semiconductor devices.

An understanding of the operation of the semiconductor switches of the present invention depends upon a knowledge of the Hall effect for producing a Hall voltage. When a semiconductor crystal is placed in a magnetic field which is perpendicular to the direction of current flowing through the crystal, a voltage is developed across the crystal in the direction perpendicular to both the current and the magnetic field. This voltage is called the Hall voltage, and it is defined by the product of the current density, the magnetic field and a constant of proportionality called the Hall coefficient.

In accordance with the present invention, the semiconductor switch comprises a crystal of semiconductor material that is doped or compensated with N-type and/or P-type impurities so that the semiconductor material has a predetermined Hall coefficient of one sign at a predetermined temperature. Switching is accomplished in response to means that change the product of the number of current carriers and their relative mobilities within the semiconductor material. The number of current carriers and/or their relative mobilities within the semiconductor material may be changed in many ways, as, for example, by directing a beam of nuclear particles onto the semiconductor material. Stressing the semiconductor material also changes the relative mobilities of the carriers. Since it can be shown that the Hall coefficient of a crystal is directly proportional to the Hall voltage, any change in the Hall coefficient produces a change in the Hall voltage, provided the current through the material is held constant and the magnetic field strength is not changed. It is an important feature of the present invention to compensate or to dope the semiconductor material to an extent whereby a predetermined Hall coefficient of one sign is obtained, under fixed conditions of current, magnetic field and temperature, and whereby an external stimulus on the semiconductor material that changes the number of current carriers and/or their relative mobilities causes the Hall coefficient of one value to change to another value, or to zero, or even to change sign.

Accordingly, it is an object of the present invention to provide a novel switch of semiconductor material that has been prepared to exhibit a predetermined Hall voltage of one value and polarity and that will provide a Hall voltage of a different value of the same polarity, or zero, or of the opposite polarity, in response to a change in the product of the current carriers and their relative mobilities in the semiconductor material.

Another object of the present invention is to provide a novel switch of semiconductor material that is an improvement over the prior art semiconductor switches in that a P–N junction and a control electrode are not necessary for the switching function.

Still another object of the present invention is to provide novel radiation detecting apparatus comprising a novel switch of semiconductor material wherein a Hall voltage of one value across the semiconductor material can be switched to a Hall voltage of a different value of the same or of the opposite polarity, or to zero by directing a beam of radiant energy onto the semiconductor material.

A further object of the present invention is to provide a novel switch of semiconductor material whose Hall voltage may be switched from one value to a different value of the same or of the opposite polarity, or zero, as a bistable element, upon the occurrence of an event.

A still further object of the present invention is to provide an improved switch of semiconductor material that may be used to detect changes in pressure on the semiconductor material by monitoring corresponding changes in the Hall voltage across the semiconductor material.

The novel features of the present invention, both as to its organization and methods of operation, as well as additional objects and advantages thereof, will be more readily understood from the following description, when read in connection with the accompanying drawings in which similar reference characters represent similar parts, and in which.

Figure 1:
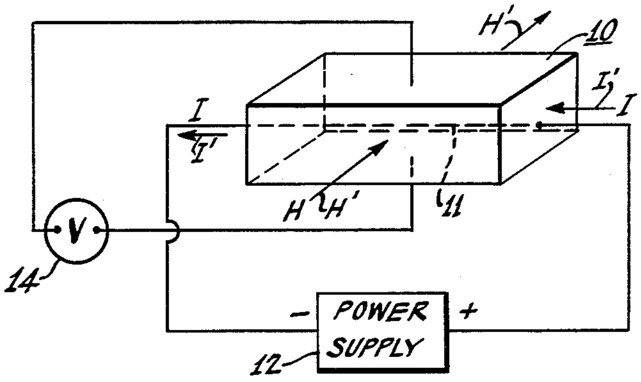
FIG. 1 is an illustrative, schematic diagram of a semiconductor crystal arranged in a circuit to exhibit a Hall voltage in known manner, this diagram being included to assist in an understanding of the invention.

Referring, now, to FIG. 1, there is shown a semiconductor crystal 10, such as p-indium arsenide (InAs) or p-indium antimonide (InSb), in a circuit for obtaining a Hall voltage. The crystal 10 is in the form of a parallelepiped slab. A unidirectional power supply 12 is connected in series with the longitudinal axis 11 of the crystal 10 to cause a current I to flow through the crystal 10 along the longitudinal axis 11 thereof, as illustrated by the arrow I'. The crystal 10 is disposed in a magnetic field H whose direction is perpendicular to the longitudinal axis 11 of the crystal 10, as illustrated by the arrows H'. Under these circumstances, a Hall voltage is developed across the crystal 10 in a direction perpendicular to both the current I and the magnetic field H. This voltage can be indicated on a voltmeter 14 connected across the crystal 10.

The amplitude and polarity of the Hall voltage may be determined from the following equation:

$$V=\frac{RIH\times 10^{-8}}{t} \quad (1)$$

where $V$=Hall voltage in volts
$R$=Hall coefficient in units of cm.$^3$/coulomb
$I$=current in amperes
$H$=magnetic field in oersteds
$t$=thickness of the crystal in cm.

From Equation 1 it will be noted that the Hall voltage is directly proportional to the Hall coefficient when the current I, the magnetic field H and the thickness $t$ of the crystal are constant.

The Hall coefficient R of the crystal 10 may be determined from the following equation:

$$R=\frac{\mu_p^2(p-b^2n)}{es^2} \quad (2)$$

where $\mu_p$=hole mobility in cm.$^2$/volt sec.
$b=\mu_e/\mu_p$
$\mu_e$=electron mobility in cm.$^2$/volt sec.
$p$=hole density in holes/cm.$^3$
$n$=electron density in electrons/cm.$^3$
$e$=electronic charge in coulombs
$s$=conductivity in 1 ohm-cm.

From Equation 2, it is evident that the sign of the Hall coefficient is determined by the magnitude of the terms within the parentheses namely, $p$, $b^2$ and $n$. Since the Hall voltage is proportional to the Hall coefficient, the polarity of the Hall voltage is dependent upon the hole density, $p$, the relative mobilities of the electrons and holes, $\mu_e/\mu_p$, and the electron density, $n$.

In accordance with the present invention, the semiconductor crystal 10 is doped or compensated with N-type and/or P-type impurities during its growth so that these impurities will provide the crystal with a Hall coefficient that is relatively near zero at a predetermined temperature. This predetermined temperature is one at which the crystal 10 is intended to operate normally.

Figure 2:
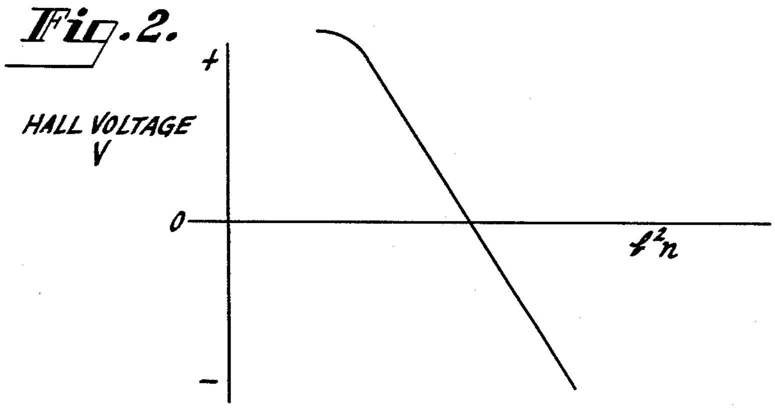
FIG. 2 is a graph of the Hall voltage plotted against the product of the number of electrons and the square of the relative mobilities of the electrons to holds within a semiconductor crystal doped or compensated in accordance with the teachings of the present invention.

Referring, now, to FIG. 2, there is shown a graph of how the Hall voltage of a crystal varies with the product of the electron density multiplied by the square of the mobility ratio. In semiconductor material, a current carrier is either a mobile conduction electron or a hole. The polarity and/or the value of the Hall voltage of a properly doped crystal can be changed, or reduced to zero, by changing the number of carriers and/or their relative mobilities. In a crystal 10 compensated as desired, a relatively small change in the number of carriers and/or their relative mobilities produces a relatively large change in the Hall voltage, as evidenced by the steepness of the curve in FIG. 2.

Figure 3:
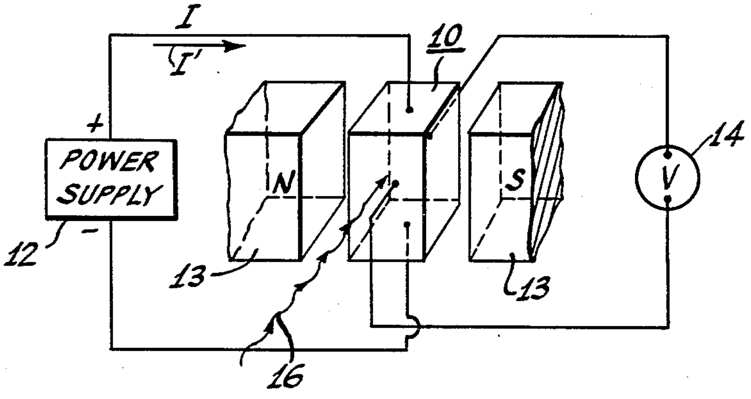
FIG. 3 is a schematic diagram of an embodiment of a semiconductor switch in a circuit adapted to detect particles of corpuscular radiation in accordance with the present invention.

In FIG. 3, there is shown a crystal 10 arranged in a circuit to measure the intensity of a beam 16 of energy, such as a beam of photons, gamma rays, X-rays, beta rays, alpha particles, and the like. In FIG. 3, a directed magnetic field is provided by the north and south poles, N, S, respectively, of a magnet 13, and a current I is provided by the power supply 12, as explained above. The crystal 10 is strategically doped to provide a Hall voltage of one polarity, say, positive, that may be indicated on the voltmeter 14 in the absence of radiation from the beam 16. When the beam 16 impinges upon the crystal 10, excess current carriers are created in the crystal 10, so that the number of current carriers and their relative mobilities within the crystal change. These changes cause a change in value of the Hall voltage across the crystal 10. The change in Hall voltage can be translated readily into a measure of the beam intensity and may be measured on the voltmeter 14.

Figures 4, 5:
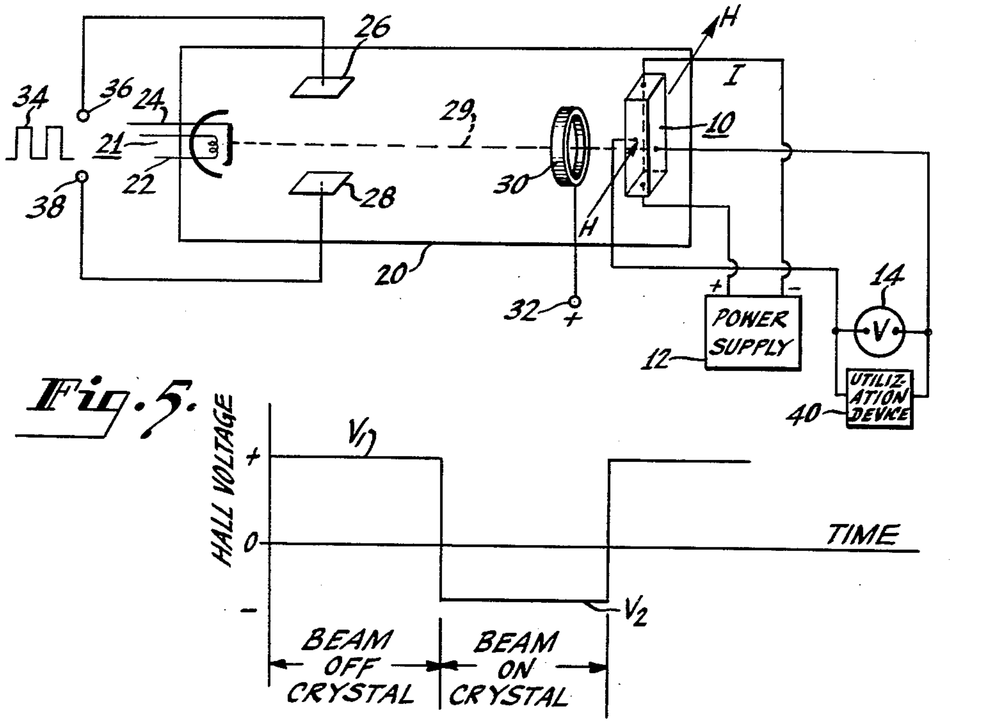
FIG. 4 is a schematic diagram of an embodiment of a semiconductor switch used as a bistable element in a logic circuit in accordance with the present invention.
FIG. 5 is a graph of the Hall voltage with respect to time produced across the semiconductor material in the circuit illustrated in FIG. 4.

In FIG. 4, there is shown a semiconductor crystal 10 within a magnetic field H and subjected to a current I to provide a Hall voltage of one polarity across the voltmeter 14. The crystal 10 is enclosed within an evacuated envelope 20 provided with a cathode ray gun 21 comprising a filament 22 and a cathode 24. A pair of (vertical) deflection plates 26 and 28 is also disposed within the envelope 20 in a manner to deflect a cathode ray beam 29 from the cathode ray gun 21 to the crystal 10. A ring anode 30 is disposed within the envelope 20, between the cathode ray gun 21 and the crystal 10, to attract the cathode ray beam 29 to the crystal 10. A terminal 32 is connected to the anode 30 to apply a positive voltage thereto. The circuitry for providing a cathode ray beam 29 within the evacuated tube 20 is not shown in order to avoid undue complexity and because such circuits are well known in the art. It will now be understood that signals, such as square waves 34, may be applied across the deflection plates 26 and 28, via input terminals 36 and 38, to deflect the cathode ray beam 29 periodically away from the crystal 10. Normally, the cathode ray beam 29 is directed onto the crystal 10. Since the cathode ray beam 29 may be considered a beam of corpuscular radiation, a change in the polarity of a Hall voltage of a properly compensated crystal 10 will occur when the cathode ray beam 29, of sufficient intensity, impinges upon the crystal 10. In a logic circuit using a binary system, a positive Hall voltage may be considered 1 and a negative Hall voltage may be considered 0, for example. The Hall voltages may be indicated on the voltmeter 14 and may be utilized in a utilization device 40, such as an adder of a computer.

Changes in the Hall voltage across the crystal 10 shown in FIG. 4 are illustrated graphically in FIG. 5. At a given temperature of the crystal 10, when the voltage across the deflection plates 26 and 28 is sufficient to deflect the cathode ray beam 29 away from the crystal 10, or if the beam is shut off, the Hall voltage is positive and of one particular value $V_1$. On the other hand, when the voltage across the deflection plates is of such value as to cause the cathode ray beam to impinge upon the crystal 10, the Hall voltage will go negative with respect to the voltage $V_1$, depending upon the intensity of the beam. Thus, the smaller the intensity of the beam which impinges upon the crystal 10, the more positive will be the Hall voltage; and conversely, the greater the intensity of the beam which impinges upon the crystal, the more negative will be the Hall voltage, and if the beam intensity is sufficiently great, the Hall voltage will change to a negative value $-V_2$. Obviously, at some intermediate beam intensity, the Hall voltage will be zero. By proper selection of the intensity of the beam which impinges upon the crystal 10, Hall voltages between the values $+V_1$ and $-V_2$ can be derived.

Figure 6:
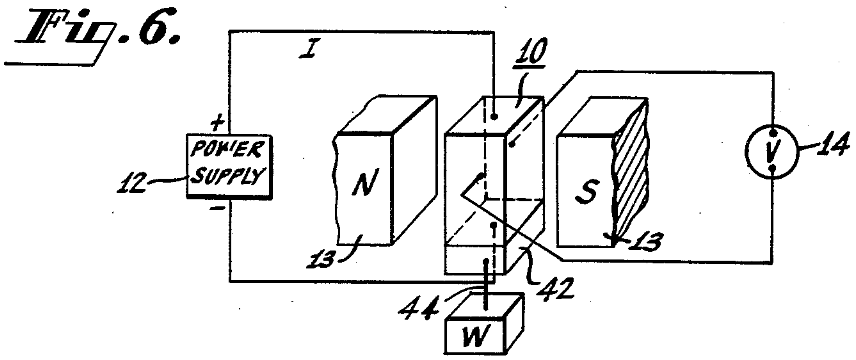
FIG. 6 is a schematic diagram of a circuit using a semiconductor switch as pressure sensing means in accordance with the present invention.

Another way of changing the relative mobilities of the current carriers in the crystal 10 is by applying a unilateral stress on the crystal 10. In FIG. 6, a crystal 10 is arranged in a circuit to provide a Hall voltage across the voltmeter 14 in the manner heretofore described. A block 42 of insulating material, such as a plastic material, is cemented to the bottom wall or face of the crystal 10, and a weight W is hung on the block 42, by means of a rod 44, to apply a unilateral stress on the crystal 10. The crystal 10 may be supported in a fixed position by any suitable means (not shown). Since the unilateral stress applied by the weight W causes a change in the relative mobilities of the current carriers in the crystal 10, the voltage across the voltmeter 14 will indicate a change in voltage when the weight W is applied to the crystal 10. Thus, the crystal 10 may be considered a transducer that provides a change in the Hall voltage of the crystal 10 when the crystal is stressed. The crystal 10 may be used as a transducer in a phonograph pickup having a stylus which corresponds to the rod 44 and through which stresses may be applied to the crystal in response to sound grooves in a record, thereby to cause changes in the Hall voltage of the crystal 10. The resultant Hall voltages may be amplified in the usual manner to produce the audio output of the phonograph.

From the foregoing description, it will be apparent that there have been provided, by the present invention, improved semi-conductor switches by means of which changes in the value of the Hall voltage are obtained. The magnitude of change of the Hall voltage is determined by the amount of the change of the current carrier density produced in the crystal. Switching, that is, changes in the Hall voltage in the examples described, is extremely rapid, the time of switching being in the order of microseconds and even faster. While only a few specific examples of semiconductor switches have been described, other semiconductor switches will, no doubt, readily suggest themselves to those skilled in the art. Hence, it is desired that the foregoing shall be considered merely as illustrative and not in a limiting sense.

What is claimed is:

In combination, a semiconductor crystal disposed in a magnetic field, circuit means connected to said semiconductor crystal to send current therethrough and to cause said crystal to exhibit a Hall voltage, said Hall voltage comprising a difference in potential across said semiconductor material in a direction that is perpendicular to the directions of said magnetic field and said current, and means physically connected to said crystal for applying a unilateral mechanical stress across said crystal, said stress causing said Hall voltage to change from one value to another value.

References Cited in the file of this patent

UNITED STATES PATENTS

| | | |
|---|---|---|
| 2,600,373 | Moore | June 10, 1952 |
| 2,825,858 | Kuhrt | Mar. 4, 1958 |
| 2,847,585 | Christian | Aug. 12, 1958 |
| 2,902,660 | Weisshaar | Sept. 1, 1959 |
| 2,907,897 | Sander | Oct. 6, 1959 |
| 2,909,679 | Abraham | Oct. 20, 1959 |
| 2,936,373 | Welker | May 10, 1960 |
| 2,942,117 | Maxwell | June 21, 1960 |
| 2,953,688 | Maxwell | Sept. 20, 1960 |
| 2,961,475 | Sommers | Nov. 22, 1960 |
| 2,988,650 | Weiss | June 13, 1961 |
| 3,011,070 | Glicksman | Nov. 28, 1961 |